(12) United States Patent
Kasuga et al.

(10) Patent No.: US 10,237,976 B2
(45) Date of Patent: Mar. 19, 2019

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Takashi Kasuga, Osaka (JP); Yoshio Oka, Osaka (JP); Jinjoo Park, Shiga (JP); Sumito Uehara, Shiga (JP); Kousuke Miura, Shiga (JP); Hiroshi Ueda, Shiga (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/127,203

(22) PCT Filed: Mar. 26, 2015

(86) PCT No.: PCT/JP2015/059498
§ 371 (c)(1),
(2) Date: Sep. 19, 2016

(87) PCT Pub. No.: WO2015/147219
PCT Pub. Date: Oct. 1, 2015

(65) Prior Publication Data
US 2017/0099732 A1    Apr. 6, 2017

(30) Foreign Application Priority Data
Mar. 27, 2014 (JP) .................................. 2014-067264

(51) Int. Cl.
*H05K 3/12* (2006.01)
*H05K 1/09* (2006.01)
(Continued)

(52) U.S. Cl.
CPC ............. *H05K 1/097* (2013.01); *H05K 1/092* (2013.01); *H05K 3/12* (2013.01); *H05K 3/246* (2013.01);
(Continued)

(58) Field of Classification Search
CPC ... H05K 1/11; H05K 3/06; H05K 3/18; H05K 3/42
See application file for complete search history.

(56) References Cited

U.S. PATENT DOCUMENTS

| 3,322,881 A | 5/1967 | Schneble et al. |
| 3,767,538 A | 10/1973 | Politycki et al. |

(Continued)

FOREIGN PATENT DOCUMENTS

| CN | 1527655 A | 9/2004 |
| CN | 101104205 A | 1/2008 |

(Continued)

OTHER PUBLICATIONS

U.S. Appl. No. 15/213,216, filed Jul. 18, 2016, Oka.
(Continued)

*Primary Examiner* — Timothy J Thompson
*Assistant Examiner* — Michael F McAllister
(74) *Attorney, Agent, or Firm* — Drinker Biddle & Reath LLP (57) ABSTRACT

A substrate for a printed circuit board according to the present invention includes a base film having an insulating property and including at least one opening; a first conductive layer that is formed on both surfaces of the base film by applying and heat-treating a conductive ink containing metal (Continued)

particles, and that fills the at least one opening; and a second conductive layer formed, by plating, on at least one of surfaces of the first conductive layer. The metal particles preferably have a mean particle size of 1 nm or more and 500 nm or less.

11 Claims, 3 Drawing Sheets

(51) Int. Cl.
    *H05K 3/24*     (2006.01)
    *H05K 3/40*     (2006.01)

(52) U.S. Cl.
    CPC ..... *H05K 3/4069* (2013.01); *H05K 2201/032* (2013.01)

(56) References Cited

U.S. PATENT DOCUMENTS

| | | | |
|---|---|---|---|
| 4,959,121 A | 9/1990 | Dumas et al. | |
| 5,196,232 A | 3/1993 | Kitazaki et al. | |
| 5,383,093 A | 1/1995 | Nagasaka | |
| 5,652,042 A * | 7/1997 | Kawakita | H01B 1/22 252/511 |
| 5,739,055 A | 4/1998 | Ryu et al. | |
| 6,258,223 B1 | 7/2001 | Cheung et al. | |
| 6,277,353 B1 * | 8/2001 | Gard | C01F 5/16 423/155 |
| 6,337,037 B1 * | 1/2002 | St. John | H01B 1/22 252/500 |
| 6,379,845 B1 | 4/2002 | Inazawa et al. | |
| 6,486,409 B1 * | 11/2002 | Sako | H05K 3/4069 174/254 |
| 6,691,409 B2 * | 2/2004 | Suzuki | H05K 1/0373 29/825 |
| 6,730,400 B1 * | 5/2004 | Komatsu | B22F 1/0018 427/220 |
| 7,470,306 B2 | 12/2008 | Inazawa et al. | |
| 8,764,960 B2 | 7/2014 | Chung et al. | |
| 2002/0004180 A1 | 1/2002 | Hotta et al. | |
| 2003/0146019 A1 * | 8/2003 | Hirai | H05K 1/097 174/257 |
| 2004/0134682 A1 | 7/2004 | En et al. | |
| 2004/0185388 A1 * | 9/2004 | Hirai | H05K 1/097 430/322 |
| 2005/0189520 A1 | 9/2005 | Okada et al. | |
| 2006/0043346 A1 | 3/2006 | Kodas et al. | |
| 2006/0055021 A1 | 3/2006 | Yamamoto | |
| 2006/0163744 A1 | 7/2006 | Vanheusden et al. | |
| 2007/0153488 A1 | 7/2007 | Yang et al. | |
| 2007/0216292 A1 | 9/2007 | Seo et al. | |
| 2007/0261234 A1 | 11/2007 | Song et al. | |
| 2008/0075836 A1 | 3/2008 | Chen et al. | |
| 2008/0083698 A1 | 4/2008 | Jung et al. | |
| 2008/0157029 A1 * | 7/2008 | Lee | B22F 1/0018 252/512 |
| 2008/0268637 A1 | 10/2008 | Inaba | |
| 2009/0139868 A1 | 6/2009 | Shrader et al. | |
| 2009/0142648 A1 | 6/2009 | Kohl et al. | |
| 2009/0202915 A1 | 8/2009 | Modeki et al. | |
| 2009/0236137 A1 | 9/2009 | Kaneda et al. | |
| 2009/0242854 A1 | 10/2009 | Li et al. | |
| 2010/0025080 A1 | 2/2010 | Park et al. | |
| 2010/0044094 A1 | 2/2010 | Oka et al. | |
| 2010/0132986 A1 | 6/2010 | Hackert et al. | |
| 2010/0261031 A1 | 10/2010 | Chung et al. | |
| 2012/0031656 A1 * | 2/2012 | Oka | C23C 28/00 174/257 |
| 2012/0118618 A1 | 5/2012 | Min | |
| 2014/0166495 A1 * | 6/2014 | Oka | C23C 28/00 205/125 |
| 2015/0147486 A1 | 5/2015 | Abed et al. | |
| 2017/0127516 A1 | 5/2017 | Kasuga et al. | |
| 2018/0014403 A1 | 1/2018 | Kasuga et al. | |

FOREIGN PATENT DOCUMENTS

| | | | |
|---|---|---|---|
| EP | 2150095 A1 | 2/2010 | |
| JP | H05-259615 A | 10/1993 | |
| JP | H06-120640 A | 4/1994 | |
| JP | H08-167768 A | 6/1996 | |
| JP | H10-18080 A | 1/1998 | |
| JP | H10-284842 A | 10/1998 | |
| JP | 2000-087121 A | 3/2000 | |
| JP | 2000-323618 A | 11/2000 | |
| JP | 2001-168496 A | 6/2001 | |
| JP | 2001-352171 A | 12/2001 | |
| JP | 2002-299833 A | 10/2002 | |
| JP | 2002-344141 A | 11/2002 | |
| JP | 2003-209341 A | 7/2003 | |
| JP | 2004-266133 A | 9/2004 | |
| JP | 3570802 B2 | 9/2004 | |
| JP | 2004-323866 A | 11/2004 | |
| JP | 2005-050965 A | 2/2005 | |
| JP | 2005-174828 A | 6/2005 | |
| JP | 2005-203484 A | 7/2005 | |
| JP | 2005-235533 A | 9/2005 | |
| JP | 2005-239472 A | 9/2005 | |
| JP | 2006-024808 A | 1/2006 | |
| JP | 2006-156617 | * | 6/2006 |
| JP | 2006-156617 A | 6/2006 | |
| JP | 2006-278845 A | 10/2006 | |
| JP | 2006-303368 A | 11/2006 | |
| JP | 2007-027454 A | 2/2007 | |
| JP | 2007-066824 A | 3/2007 | |
| JP | 2008-085345 A | 4/2008 | |
| JP | 2008-168585 A | 7/2008 | |
| JP | 2008-283012 A | 11/2008 | |
| JP | 2012-114152 A | 6/2012 | |
| JP | 2013-118362 A | 6/2013 | |
| JP | 2013-254910 A | 12/2013 | |
| KR | 10-2012-0051991 | * | 5/2012 |
| KR | 1020120051991 | * | 5/2012 |
| WO | WO-00/10736 A1 | 3/2000 | |
| WO | WO 00/33625 A | 6/2000 | |
| WO | WO-02/096168 A2 | 11/2002 | |
| WO | WO 2007/015545 A1 | 2/2007 | |
| WO | WO-2007/112971 A2 | 10/2007 | |
| WO | WO-2010/122918 A1 | 10/2010 | |

OTHER PUBLICATIONS

U.S. Appl. No. 15/214,278, filed Jul. 19, 2016, Oka.
U.S. Appl. No. 15/127,165, filed Sep. 19, 2016, Kasuga et al.
U.S. Office Action dated Dec. 15, 2016 that issued in U.S. Appl. No. 13/265,108.
U.S. Advisory Action dated Apr. 12, 2017 that issued in related U.S. Appl. No. 14/185,206.
U.S. Office Action dated Apr. 19, 2017 that issued in related U.S. Appl. No. 13/265,108.
U.S. Office Action dated Apr. 11, 2017 including an Election/Restriction Requirement that issued in related U.S. Appl. No. 15/127,165.
U.S. Office Action dated Jun. 8, 2017 that issued in related U.S. Appl. No. 14/185,206.
U.S. Office Action dated Jan. 12, 2017 that issued in U.S. Appl. No. 14/185,206.
U.S. Notice of Allowance dated Aug. 2, 2017 that issued in related U.S. Appl. No. 15/127,165.
U.S. Final Office Action dated Sep. 15, 2017 that issued in related U.S. Appl. No. 14/185,206.
U.S. Office Action dated Sep. 21, 2017 that issued in related U.S. Appl. No. 15/213,216.
U.S. Office Action dated Oct. 19, 2017 that issued in related U.S. Appl. No. 15/214,278.
U.S. Office Action dated Dec. 19, 2017, that issued in related U.S. Appl. No. 14/185,206.

(56) References Cited

OTHER PUBLICATIONS

U.S. Notice of Allowance dated Oct. 25, 2017, that issued in related U.S. Appl. No. 15/127,165.
U.S. Office Action dated Feb. 5, 2018 that issued in U.S. Appl. No. 15/544,961 including double patenting rejections at pp. 2-5.
U.S. Notice of Allowance dated Dec. 21, 2017 that issued in U.S. Appl. No. 15/127,165.
U.S. Notice of Allowance dated Feb. 7, 2018 that issued in U.S. Appl. No. 15/127,165.
U.S. Office Action dated Mar. 8, 2018 that issued in U.S. Appl. No. 15/214,278.
U.S. Office Action dated Mar. 7, 2018 that issued in U.S. Appl. No. 15/213,216.
U.S. Notice of Allowability and the Notice of Allowance dated Apr. 30, 2018 that issued in related U.S. Appl. No. 15/544,961.
Final Office Action dated May 2, 2018 that issued in related U.S. Appl. No. 14/185,206.

* cited by examiner

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board.

BACKGROUND ART

In recent years, with the trend toward electronic devices having a smaller size and higher performance, there has been a need for a higher density of printed circuit boards. As a substrate for a printed circuit board that satisfies such a need for a higher density, there has been a demand for a substrate for a printed circuit board in which conductive layers have smaller thicknesses.

In order to meet the demand, a substrate for a printed circuit board has been proposed in which a thin copper layer is formed on a heat-resistant insulating base film without using an adhesive layer therebetween (refer to Japanese Patent No. 3570802). In this conventional substrate for a printed circuit board, thin copper layers (first conductive layers) are formed on both surfaces of a heat-resistant insulating base film by sputtering and, on the layers, thick copper layers (second conductive layers) are formed by electroplating.

CITATION LIST

Patent Literature

PTL 1: Japanese Patent No. 3570802

SUMMARY OF INVENTION

Technical Problem

The above-described conventional substrate for a printed circuit board basically satisfies the need for high-density printed circuits in that a reduction in the thicknesses of conductive layers is achieved. However, in the conventional substrate for a printed circuit board, the first conductive layers are formed on the surfaces of the base film by sputtering. This provides conductive layers (copper foil layers) having only a thickness of about 0.3 µm. For this reason, when an opening is formed so as to extend through the base film, the copper foil layers forming the first conductive layers cannot fill the opening. Thus, a land for mounting a component cannot be formed above the opening. This may result in a decrease in the area for mounting components of the printed circuit board.

Under the above-described circumstances, the present invention has been made. An object is to provide a substrate for a printed circuit board, a printed circuit board, and a method for producing a substrate for a printed circuit board in which the openings of the base films are densely filled with conductors to provide high conductivity.

Solution to Problem

A substrate for a printed circuit board according to an embodiment of the present invention, which has been made to address the above-described problem, includes a base film having an insulating property and including at least one opening; a first conductive layer that is formed on both surfaces of the base film by applying and heat-treating a conductive ink containing metal particles, and that fills the at least one opening; and a second conductive layer formed, by plating, on at least one of surfaces of the first conductive layer.

A printed circuit board according to another embodiment of the present invention, which has been made to address the above-described problem, is a printed circuit board employing the above-described substrate for a printed circuit board and including a conductive pattern, wherein the conductive pattern is formed by a subtractive method or a semi-additive method.

A method for producing a substrate for a printed circuit board according to still another embodiment of the present invention, which has been made to address the above-described problem, includes a step of applying a conductive ink containing metal particles to both surfaces of a base film having an insulating property and including at least one opening, and performing heating at 150° C. or more and 500° C. or less in an atmosphere having an oxygen concentration of 1 ppm or more and 10,000 ppm or less to form a first conductive layer formed on both surfaces of the base film and filling the at least one opening; and a step of performing plating to form a second conductive layer on at least one of surfaces of the first conductive layer, wherein the metal particles have a mean particle size of 1 nm or more and 500 nm or less.

Advantageous Effects of Invention

In a substrate for a printed circuit board, a printed circuit board, and a method for producing a substrate for a printed circuit board according to the present invention, the openings of the base films are densely filled with conductors to thereby provide high conductivity.

DESCRIPTION OF EMBODIMENTS

Description of Embodiments of the Present Invention

Embodiments according to the present invention will be first listed and described.

A substrate for a printed circuit board according to an embodiment of the present invention includes a base film having an insulating property and including at least one opening; a first conductive layer that is formed on both surfaces of the base film by applying and heat-treating a conductive ink containing metal particles, and that fills the at least one opening; and a second conductive layer formed, by plating, on at least one of surfaces of the first conductive layer.

In the substrate for a printed circuit board, the first conductive layer is formed on both surfaces of the base film by applying and heat-treating a conductive ink containing metal particles, and fills such an opening. As a result, the opening is densely filled with the metal particles and the substrate has high conductivity. In the substrate for a printed circuit board, since the first conductive layer fills the opening, a land for mounting a component can be provided above the opening, which enables formation of a printed circuit board having a large area for mounting components. In addition, in the substrate for a printed circuit board, since the second conductive layer is formed by plating on at least one of the surfaces of the first conductive layer, the metal of the second conductive layer fills the gaps between the metal particles forming the first conductive layer, to thereby suppress separation of the conductive layer from the base film, the separation being likely to start from breaking at the gaps. Incidentally, the second conductive layer formed by plating may be formed by, for example, electroless plating or electroplating. Alternatively, the second conductive layer may be formed by electroless plating and further by electroplating.

The metal particles preferably have a mean particle size of 1 nm or more and 500 nm or less. Use of a conductive ink containing such metal particles having a mean particle size within this range enables the metal particles to more densely fill the opening to thereby provide more stable conductivity. Incidentally, "mean particle size" used here means the median diameter D50 in the particle size distribution in the dispersion liquid. The mean particle size can be measured with a particle size distribution analyzer (for example, Microtrac particle size analyzer "UPA-150EX" from NIKKISO CO., LTD.).

Both of the surfaces of the base film are preferably subjected to a hydrophilic treatment. When both of the surfaces of the base film are thus subjected to a hydrophilic treatment, the conductive ink exhibits a decreased surface tension to the base film. This facilitates uniform application of the conductive ink to both surfaces of the base film and filling of the opening with the conductive ink. As a result, the first conductive layer is easily formed so as to have a uniform thickness on both surfaces of the base film.

The metal is preferably copper. When the metal is thus copper, the first conductive layer has increased conductivity, which enables production of a printed circuit board having high conductivity.

Regions of the first conductive layer, the regions each being within 500 nm from an interface between the first conductive layer and one or another of the surfaces of the base film, and a region within the at least one opening preferably have a porosity of 1% or more and 50% or less. Thus, these regions in the first conductive layer are each formed so as to have a porosity within the range, so that the strength of the first conductive layer and the base film is not reduced by excessive heat during the heat treatment, to thereby enhance the separation strength between the base film and the first conductive layer. Here, "regions of the first conductive layer, the regions each being within 500 nm from an interface between the first conductive layer and one or another of the surfaces of the base film" means, in portions of the first conductive layer where the thickness is less than 500 nm, regions within the first conductive layer. Here, "porosity" denotes a value calculated as the area ratio of pores observed on an electron micrograph of a section.

A ratio of a maximum depth, with respect to one of the surfaces of the base film, of a recess of the first conductive layer formed within the at least one opening, to an average thickness of the base film is preferably 50%. Thus, the ratio of the maximum depth of the recess of the first conductive layer to the average thickness of the base film is set to such an upper limit or less, to thereby achieve a decrease in the via resistance and enhancement of the connection reliability. In addition, the formability of a land part above such an opening can be enhanced. Here, "via resistance" means the resistance between both ends of the opening filled with the first conductive layer.

A ratio of an average thickness of the base film to a larger diameter out of diameters of the at least one opening that are positioned at both of the surfaces of the base film is preferably 0.2 or more and 2.0 or less. Thus, the ratio of the average thickness of the base film to the larger diameter of such an opening is set to be within the range, so that the opening can be filled with the conductive ink with more certainty.

A ratio of one diameter to another diameter out of diameters of the at least one opening that are positioned at both of the surfaces of the base film is preferably 0.2 or more and less than 1.0. Thus, the ratio of one of the diameters of such an opening to the other diameter is set to be within the range, so that the opening can be filled with the conductive ink with more ease and certainty.

Regions near interfaces between the base film and the first conductive layer preferably contain a metal oxide species based on the metal of the metal particles and a metal hydroxide species based on the metal. The inventors performed thorough studies and, as a result, have found the following findings: the larger the amount of the metal oxide in the regions near the interfaces between the base film and the conductive layer of a substrate for a printed circuit board, the higher the adhesion strength between the base film and the conductive layer; the larger the amount of the metal hydroxide in the regions near the interfaces, the lower the adhesion strength. In other words, when the regions near the interfaces between the base film and the first conductive layer contain a metal oxide species based on the metal of the metal particles and a metal hydroxide species based on the metal, high adhesion strength is provided between the base film and the first conductive layer. Incidentally, "the regions near the interfaces" used here means regions each extending for predetermined ranges in both of the thickness directions from an interface between the base film and the first conductive layer. Such a predetermined range may be set to, for example, a distance that is about half of the thickness of the first conductive layer, preferably 0.1 μm. Here, "metal oxide species" denotes metal oxide or a group derived from the metal oxide; and "metal hydroxide species" denotes metal hydroxide or a group derived from the metal hydroxide. Here, "a group derived from the metal oxide" means a compound or group containing an oxygen that is bonded to the metal and also bonded to a non-hydrogen atom not on the metal side but on the other side. When the metal is copper, examples of "a group derived from the metal oxide" include CuOC—R, CuON—R, and CuOOC—R (where R represents an alkyl group). Here, "a group derived from the metal hydroxide" means a compound or group containing an oxygen that is bonded to the metal and also bonded to a hydrogen not on the metal side but on the other side. Incidentally, a compound or group containing both of such an oxygen bonded to the metal and also bonded to a non-hydrogen atom not on the metal side but on the other side and such an oxygen bonded to the metal and also bonded to a hydrogen not on the metal side but on the other side, is classified as "a metal hydroxide or a group derived from the metal hydroxide". Thus, when the metal is copper, for example, CuOH, $Cu(OH)_2$, $CuSO_4.3Cu(OH)_2$, $CuCO_3.Cu(OH)_2$, $CuCl_2.Cu(OH)_2$, and $(Cu(OH)CH_3COO)_2.5H_2O$ belong to "metal hydroxide species".

The metal oxide species preferably has a mass per unit area of 0.1 μg/cm$^2$ or more and 10 μg/cm$^2$ or less, and a mass ratio of the metal oxide species to the metal hydroxide species is preferably 0.1 or more. When the mass per unit area of the metal oxide species in the regions near the interfaces between the base film and the first conductive layer is within such a range, and the mass ratio of the metal oxide species to the metal hydroxide species is such a lower limit or more, the adhesion strength between the base film and the first conductive layer is further enhanced.

The metal particles are preferably obtained by a liquid-phase reduction method of reducing metal ions with a reducing agent in an aqueous solution. When the metal particles are thus obtained by the liquid-phase reduction method, compared with gas-phase methods, a relatively simple apparatus can be used for obtaining the particles, which enables a reduction in the production costs. In addition, such metal particles can be mass-produced with ease, which enables high availability of the metal particles. Furthermore, for example, stirring in the aqueous solution can easily make such metal particles have a uniform particle size.

The liquid-phase reduction method is preferably a titanium redox process. Thus, when the metal particles are obtained by the titanium redox process, the particle size can be set to a desired size on the order of nanometers with certainty and ease, and metal particles having a round shape and similar sizes tend to be obtained. As a result, the first conductive layer is formed as a dense and uniform layer having less defects, to fill the opening more densely and uniformly.

A printed circuit board according to an embodiment of the present invention includes a conductive pattern, wherein the conductive pattern is formed by performing a subtractive method or a semi-additive method on the first conductive layer and the second conductive layer of the above-described substrate for a printed circuit board.

The printed circuit board is produced with the above-described substrate for a printed circuit board, and hence has high conductivity. In addition, a land for mounting a component can be provided above the opening of the base film, which enables an increase in the area for mounting components.

A method for producing a substrate for a printed circuit board according to an embodiment of the present invention includes a step of applying a conductive ink containing metal particles to both surfaces of a base film having an insulating property and including at least one opening, and performing heating at 150° C. or more and 500° C. or less in an atmosphere having an oxygen concentration of 1 ppm or more and 10,000 ppm or less to form a first conductive layer formed on both surfaces of the base film and filling the at least one opening; and a step of performing plating to form a second conductive layer on at least one of surfaces of the first conductive layer, wherein the metal particles have a mean particle size of 1 nm or more and 500 nm or less.

According to the method for producing a substrate for a printed circuit board, a conductive ink containing metal particles having the above-described particle size is applied to both surfaces of the base film having at least one opening and is heated to form a first conductive layer formed on both surfaces of the base film and filling the at least one opening. Thus, according to the method for producing a substrate for a printed circuit board, even in the case of using a base film having a large thickness relative to the diameter of the opening, the first conductive layer can be formed so as to densely fill the opening, to thereby produce a substrate for a printed circuit board having high conductivity. In addition, according to the method for producing a substrate for a printed circuit board, after the conductive ink is applied, the first conductive layer is formed in an atmosphere having an oxygen concentration satisfying the above-described range and at a heating temperature satisfying the above-described range. This enables production of a substrate for a printed circuit board, the substrate having high adhesion strength between the base film and the first conductive layer. Incidentally, in the step of forming the second conductive layer, for example, electroless plating may be performed to form the second conductive layer; or electroplating may be performed to form the second conductive layer; or electroless plating may be performed and followed by electroplating to form the second conductive layer.

The conductive ink preferably exhibits a surface tension of 10 mN/m or more and 100 mN/m or less. When the surface tension of the conductive ink is within the range, the conductive ink can be uniformly applied with ease on the surfaces of the base film, and the opening of the base film can be filled with the conductive ink with certainty. Incidentally, the surface tension of the conductive ink can be measured with a surface tensiometer (for example, "DY-300" from Kyowa Interface Science Co., Ltd.) and is measured in accordance with JIS-K2241 (2000).

DETAILS OF EMBODIMENTS OF THE PRESENT INVENTION

Hereinafter, a substrate for a printed circuit board, a printed circuit board, and a method for producing a substrate for a printed circuit board according to embodiments of the present invention will be described with reference to drawings.

[Substrate for Printed Circuit Board]

Figure 1:
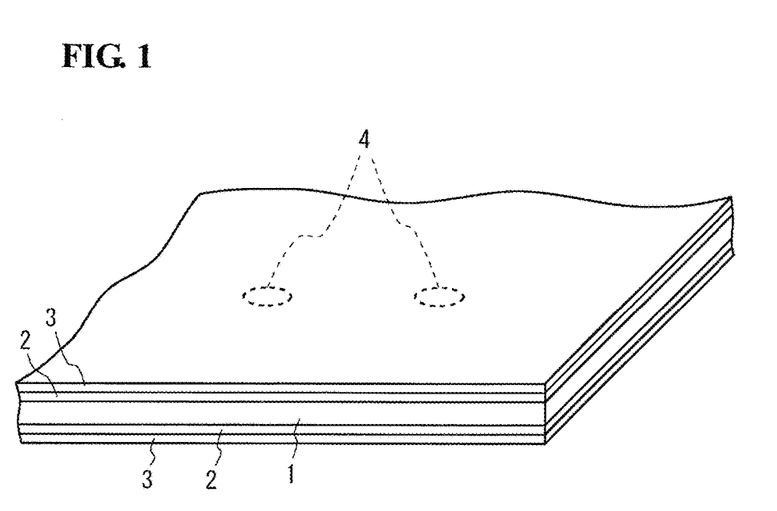
FIG. 1 is a schematic perspective view of a substrate for a printed circuit board according to an embodiment of the present invention.

The substrate for a printed circuit board in FIG. 1 mainly includes a base film 1 having an insulating property and including plural openings 4; a first conductive layer 2 that is formed on both surfaces of the base film 1 by applying and heat-treating a conductive ink containing metal particles, and that fills the openings 4; and second conductive layers 3 formed, by plating, on the surfaces of the first conductive layer 2.

<Base Film>

The base film 1 in FIG. 1 for forming a substrate for a printed circuit board has an insulating property and includes plural openings 4 formed therein. Examples of the material for the base film 1 include flexible resins such as polyimide, liquid crystal polymers, Teflon (registered trademark), fluororesins, polyethylene terephthalate, and polyethylene naphthalate; rigid materials such as phenolic resin impregnated paper, epoxy impregnated paper, glass composites, epoxy impregnated fiberglass cloth, and glass base materials; and rigid-flexible materials that are composites of hard material and soft material. Of these, particularly preferred is polyimide because it exhibits high bonding strength to metal oxide species.

Since the thickness of the base film 1 is set in accordance with the printed circuit board for which the substrate for a printed circuit board is used, the thickness is not particularly limited. However, for example, the lower limit of the average thickness of the base film 1 is preferably 7.5 µm, more preferably 10 µm. The upper limit of the average thickness of the base film 1 is preferably 70 µm, more preferably 50 µm. When the average thickness of the base film 1 is less than the lower limit, the base film 1 may have insufficient strength. On the other hand, when the average thickness of the base film 1 is more than the upper limit, the openings 4 may not be densely filled with the first conductive layer 2.

Before the base film 1 is coated with the conductive ink, the surfaces of the base film 1 and the inner walls of the openings 4 are preferably subjected to a hydrophilic treatment. The hydrophilic treatment may be, for example, a plasma treatment of applying plasma to make the surfaces hydrophilic, or an alkali treatment of using an alkali solution to make the surfaces hydrophilic. By subjecting the base film 1 to such a hydrophilic treatment, the conductive ink exhibits a decreased surface tension to the base film 1, which facilitates uniform application of the conductive ink to the base film 1.

(Openings)

The openings 4 have a circular shape in plan view, and perpendicularly extend from one to the other of the surfaces of the base film 1. Here, such an opening 4 can be formed from one of the surfaces of the base film 1 by, for example, drilling or laser processing; in this case, the opening 4 is formed such that its diameter decreases from the one surface to the other surface. In other words, in this case, out of the diameters of the opening 4 that are positioned at both surfaces of the base film 1, the diameter at the one surface is larger than the diameter at the other surface. In this way, the opening 4 is formed such that the diameter at one surface is larger than the diameter at the other surface, which facilitates filling with the conductive ink through the one surface.

Out of the diameters of the opening 4 that are positioned at both surfaces of the base film 1, the lower limit of the larger diameter is preferably 10 µm, more preferably 20 µm. The upper limit of the larger diameter of the opening 4 is preferably 200 µm, more preferably 100 µm. When the larger diameter of the opening 4 is less than the lower limit, filling the opening 4 with the first conductive layer 2 may still result in insufficient conductivity. On the other hand, when the larger diameter of the opening 4 is more than the upper limit, the opening 4 may not be filled with the first conductive layer 2.

Regarding the ratio of the average thickness of the base film 1 to the larger diameter out of the diameters of the opening 4 that are positioned at both surfaces of the base film 1, the lower limit is preferably 0.2, more preferably 0.3.

The upper limit of the ratio is preferably 2.0, more preferably 1.5, still more preferably 1.0. When the ratio is less than the lower limit, the opening 4 may not be filled to its radial center with the first conductive layer 2. On the other hand, when the ratio is more than the upper limit, application of the conductive ink to both surfaces of the base film 1 may not achieve filling of the opening 4 to its center in the thickness direction with the first conductive layer 2.

Regarding the ratio of one diameter to the other diameter out of the diameters of the opening 4 that are positioned at both surfaces of the base film 1, the lower limit is preferably 0.2, more preferably 0.5, still more preferably 0.7. The ratio is preferably less than 1.0, more preferably less than 0.96. When the ratio is less than the lower limit, the opening 4 may have an excessively small diameter at a surface of the base film 1, the surface being on a side opposite to a side where filling with the conductive ink is performed, so that filling of the opening 4 with the conductive ink may not be achieved. Also, the opening 4 may have an excessively large diameter on the side where filling with the conductive ink is performed, so that a land part may be difficult to form above the opening 4. Conversely, when the ratio is more than the upper limit, filling of the opening 4 with the conductive ink may be difficult to achieve.

<First Conductive Layer>

The first conductive layer 2 is formed, by applying a conductive ink containing metal particles, on both surfaces of the base film 1 and fills the openings 4. In the substrate for a printed circuit board, the conductive ink is applied to thereby form the first conductive layer 2. As a result, the openings 4 can be easily filled with the conductive ink, and both surfaces of the base film 1 can be covered by the conductive film. Incidentally, in order to remove unwanted organic matter and the like in the conductive ink to thereby fix the metal particles to the openings 4 and both surfaces of the base film 1 with certainty, the first conductive layer 2 is preferably formed by heat-treating the applied conductive ink.

(Conductive Ink)

The conductive ink forming the first conductive layer 2 contains metal particles as a conductive material providing conductivity. This embodiment employs the conductive ink that contains metal particles, a dispersing agent for dispersing the metal particles, and a dispersion medium. Application of such a conductive ink causes the first conductive layer 2 of fine metal particles to be formed on both surfaces of the base film 1 and to fill the openings 4.

Incidentally, the conductive ink forming the first conductive layer 2 does not contain any resin binder. Thus, the conductive ink having been applied does not undergo shrinkage due to drying. For this reason, the dense filling state of the metal particles at the time of application is maintained, so that drying after the application does not cause a decrease in the conductivity of the first conductive layer 2.

The metal forming the metal particles contained in the conductive ink is a metal that enables generation of a metal oxide species based on the metal and a metal hydroxide species based on the metal in regions of the first conductive layer 2, the regions being near the interfaces between the first conductive layer 2 and the base film 1 in the substrate for a printed circuit board. The metal may be copper (Cu), nickel (Ni), aluminum (Al), gold (Au), or silver (Ag). Of these, copper is preferably used as a metal that has high conductivity and exhibits high adhesion to the base film 1.

Regarding the metal particles contained in the conductive ink, the lower limit of the mean particle size is 1 nm, more preferably 30 nm. The upper limit of the mean particle size of the metal particles is 500 nm, more preferably 100 nm. When the mean particle size of the metal particles is less than the lower limit, the metal particles in the conductive ink may have degraded dispersibility and stability. When the mean particle size of the metal particles is more than the upper limit, the metal particles may tend to precipitate and the conductive ink applied tends not to have a uniform density of the metal particles.

Regarding the surface tension of the conductive ink to the surfaces of the base film 1, the lower limit is preferably 10 mN/m, more preferably 20 mN/m. The upper limit of the surface tension is preferably 160 mN/m, more preferably 140 mN/m. When the surface tension is less than the lower limit, the conductive ink may not stay within the openings 4, so that the conductive ink may not fill the openings 4. On the other hand, when the surface tension is high, the conductive ink can fill even the openings 4 of the base film 1 that has a large thickness relative to the diameters of the openings 4; however, when the surface tension is more than the upper limit, it may become difficult to uniformly apply the conductive ink on the surfaces of the base film 1. The surface tension of the conductive ink can be controlled with, for example, selection of the medium into which the metal particles are dispersed.

The lower limit of the average thickness of the first conductive layer 2 is preferably 0.05 μm, more preferably 0.1 μm. The upper limit of the average thickness of the first conductive layer 2 is preferably 2 μm, more preferably 1.5 μm. When the average thickness of the first conductive layer 2 is less than the lower limit, the first conductive layer 2 may have large portions not containing metal particles in the thickness direction, resulting in low conductivity. On the other hand, when the average thickness of the first conductive layer 2 is more than the upper limit, it may become difficult to achieve a reduction in the thickness of conductive layers.

In regions of the first conductive layer 2, the regions each being within 500 nm from the interface between the first conductive layer 2 and one or the other of the surfaces of the base film 1, and in the regions within the openings 4, the lower limit of the porosity is preferably 1%, more preferably 2%. On the other hand, the upper limit of the porosity is preferably 50%, more preferably 30%, still more preferably 20%. When the porosity is less than the lower limit, in order to decrease the porosity, heat treatment at high temperature for a long time is required. This causes degradation of the base film 1, which may result in insufficient separation strength between the base film 1 and the first conductive layer 2. Conversely, when the porosity is more than the upper limit, the base film 1 and the first conductive layer 2 have a small adhesion area therebetween, which may result in insufficient separation strength between the base film 1 and the first conductive layer 2. For example, in the step of forming circuitry of a printed circuit board described later, the substrate for a printed circuit board is subjected to mechanical stress due to handling or transportation. However, the porosity is adjusted to be within the above-described range, to thereby suppress separation of the first conductive layer 2 from the base film 1 during the step of forming circuitry.

When the conductive ink is applied to both surfaces of the base film 1, the conductive ink around such an opening 4 flows into the opening 4, resulting in formation of a recess, within the opening 4, in the outer surface of the first conductive layer 2. Regarding the ratio of the maximum depth, with respect to one of the surfaces of the base film 1, of the recess of the first conductive layer 2 formed within the opening 4, to the average thickness of the base film 1, the upper limit is preferably 50%, more preferably 30%. When the ratio is more than the upper limit, high via resistance may result in degraded connection reliability and it may become difficult to form a land part above the opening 4.

The regions near the interfaces between the base film 1 and the first conductive layer 2 preferably contain a metal oxide species based on the metal of the metal particles and a metal hydroxide species based on the metal. The metal oxide species and the metal hydroxide species are an oxide and a hydroxide generated, during heat treatment after application of the conductive ink, on the basis of metal particles contained in the first conductive layer 2. For example, when copper is used for the metal particles, copper oxide ($CuO$) or a group derived from copper oxide and copper hydroxide ($Cu(OH)_2$) or a group derived from copper hydroxide are generated and present in the regions near the interfaces between the base film 1 and the first conductive layer 2. When the regions near the interfaces between the base film 1 and the first conductive layer 2 contain a predetermined amount of the metal oxide species, and the mass ratio of the metal oxide species to the metal hydroxide species is a predetermined value or more, the first conductive layer 2 and the base film 1 have increased adhesion strength therebetween, so that the first conductive layer 2 tends not to separate from the base film 1.

Regarding the metal oxide species in the regions near the interfaces between the base film 1 and the first conductive layer 2, the lower limit of the mass per unit area is preferably 0.1 μg/cm$^2$, more preferably 0.15 μg/cm$^2$. The upper limit of the mass per unit area of the metal oxide species is preferably 10 μg/cm$^2$, more preferably 5 μg/cm$^2$. When the mass per unit area of the metal oxide species is less than the lower limit, the metal oxide provides a weaker effect of enhancing the bonding strength between the first conductive layer 2 and the base film 1, which may result in a decrease in the adhesion strength between the base film 1 and the first conductive layer 2. On the other hand, when the mass per unit area of the metal oxide species is more than the upper limit, heat treatment after application of the conductive ink may become difficult to control.

Regarding the metal hydroxide species in the regions near the interfaces between the base film 1 and the first conductive layer 2, the lower limit of the mass per unit area is preferably 1 μg/cm$^2$, more preferably 1.5 μg/cm$^2$. The upper limit of the mass per unit area of the metal hydroxide species is preferably 100 μg/cm$^2$, more preferably 50 μg/cm$^2$. When the mass per unit area of the metal hydroxide species is less than the lower limit, after application of the conductive ink, heat treatment for generating a large amount of the metal oxide species may become difficult to control. On the other hand, when the mass per unit area of the metal hydroxide species is more than the upper limit, the amount of the metal oxide species correspondingly decreases, so that the metal oxide provides a weaker effect of enhancing the bonding strength between the first conductive layer 2 and the base film 1. This may result in a decrease in the adhesion strength between the base film 1 and the first conductive layer 2.

Regarding the mass ratio of the metal oxide species to the metal hydroxide species in the regions near the interfaces between the base film 1 and the first conductive layer 2, the lower limit is 0.1, more preferably 0.2. The upper limit of the mass ratio is preferably 5, more preferably 3. When the mass ratio is less than the lower limit, the metal hydroxide species has an excessively large amount relative to the metal oxide species in the regions near the interfaces, which may result in a decrease in the adhesion strength between the base film 1 and the first conductive layer 2. On the other hand, when the mass ratio is more than the upper limit, heat treatment after application of the conductive ink may become difficult to control.

<Second Conductive Layers>

Each second conductive layer 3 is formed by electroless plating on a surface of the first conductive layer 2, the surface being on a side opposite to the base film 1. Thus, the second conductive layer 3 is formed by electroless plating, so that the gaps between the metal particles forming the first conductive layer 2 are filled with the metal of the second conductive layer 3. In this way, the electroless-plating metal fills the gaps between the metal particles to reduce the amount of gaps between the metal particles, to thereby suppress separation of the first conductive layer 2 from the base film 1, the separation starting from breaking at such gap portions.

Examples of the metal used for the electroless plating include highly conductive metals such as copper, nickel, and silver. When copper is used for the metal particles forming the first conductive layer 2, copper or nickel is preferably used in consideration of adhesion to the first conductive layer 2.

Regarding the second conductive layer 3 formed by electroless plating, the lower limit of the average thickness is preferably 0.2 μm, more preferably 0.3 μm. Regarding the second conductive layer 3 formed by the electroless plating, the upper limit of the average thickness is preferably 1 μm, more preferably 0.5 μm. When the average thickness of the second conductive layer 3 formed by the electroless plating is less than the lower limit, the second conductive layer 3 may insufficiently fill the gap portions of the first conductive layer 2, which may result in a decrease in the conductivity. On the other hand, when the average thickness of the second conductive layer 3 formed by the electroless plating is more than the upper limit, the time required for the electroless plating may increase, which may result in a decrease in the productivity.

Alternatively, formation of a thin layer by the electroless plating is preferably followed by electroplating to form a thick second conductive layer 3. The electroless plating is followed by electroplating, so that the thickness of the conductive layer can be adjusted with ease and accuracy, and the conductive layer having a thickness required for formation of a printed circuit can be formed in a relatively short time. Examples of the metal used for the electroplating include highly conductive metals such as copper, nickel, and silver.

The thickness of the second conductive layer 3 after the electroplating is set in accordance with the printed circuit to be formed and is not particularly limited. However, regarding the second conductive layer 3 after the electroplating, for example, the lower limit of the average thickness is preferably 1 μm, more preferably 2 μm. Regarding the second conductive layer 3 after the electroplating, the upper limit of the average thickness is preferably 100 μm, more preferably 50 μm. When the average thickness of the second conductive layer 3 after the electroplating is less than the lower limit, the conductive layer may be easily damaged. On the other hand, when the average thickness of the second conductive layer 3 after the electroplating is more than the upper limit, a reduction in the thickness of the printed circuit board may become difficult to achieve.

[Method for Producing Substrate for Printed Circuit Board]

The method for producing a substrate for a printed circuit board includes an opening formation step of forming an opening in a base film having an insulating property; a step of forming a first conductive layer (first-conductive-layer formation step) by application of a conductive ink containing metal particles to both surfaces of the base film having the opening, and by heating at a predetermined temperature or higher in an atmosphere having a predetermined oxygen concentration or higher; and a step of forming a second conductive layer (second-conductive-layer formation step) on at least one of the surfaces of the first conductive layer by plating.

<Opening Formation Step>

Figure 2A:
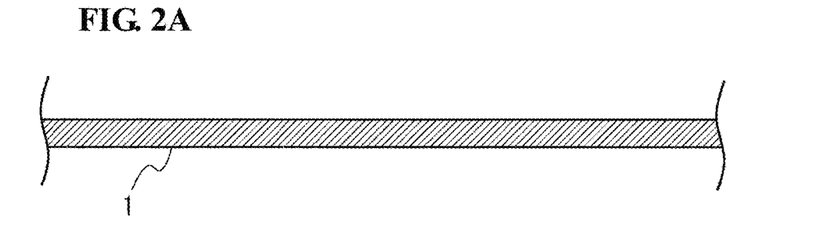
FIG. 2A is a schematic partial sectional view illustrating a method for producing the substrate for a printed circuit board in FIG. 1.
Figure 2B:
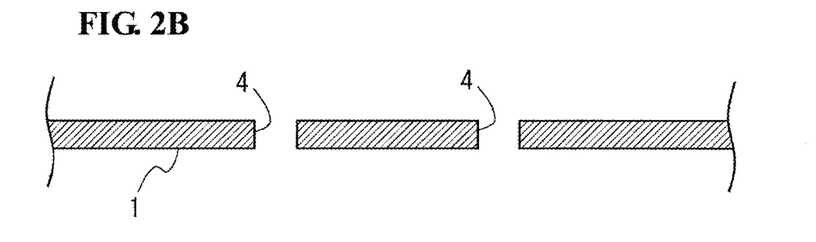
FIG. 2B is a schematic partial sectional view illustrating a step subsequent to that of FIG. 2A in the method for producing the substrate for a printed circuit board in FIG. 1.

In the opening formation step, a base film 1 having an insulating property in FIG. 2A is subjected to, for example, drilling or laser processing to form plural openings 4 (FIG. 2B).

<First-Conductive-Layer Formation Step>

Figure 2C:
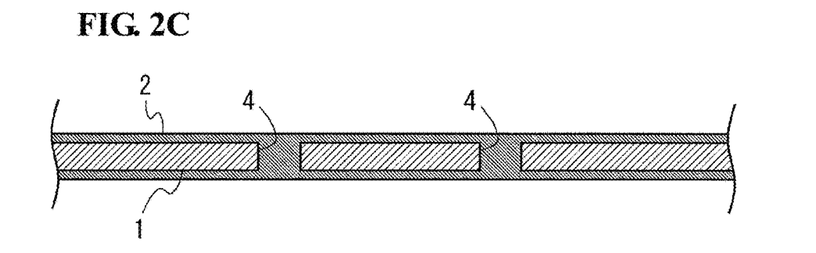
FIG. 2C is a schematic partial sectional view illustrating a step subsequent to that of FIG. 2B in the method for producing the substrate for a printed circuit board in FIG. 1.

In the first-conductive-layer formation step, as illustrated in FIG. 2C, a conductive ink containing metal particles is applied to both surfaces of the base film 1, dried, and subsequently heat-treated. The conductive ink is applied to both surfaces of the base film 1, so that the conductive ink fills the openings 4.

(Method for Producing Metal Particles)

Here, a method for producing metal particles to be dispersed in the conductive ink will be described. The metal particles can be produced by, for example, a high-temperature treatment method, a liquid-phase reduction method, or a gas-phase method.

The liquid-phase reduction method is performed to produce the metal particles in the following manner: for example, a dispersing agent and a water-soluble metal compound serving as the source of metal ions that are to form the metal particles are dissolved in water, and a reducing agent is added to cause a reduction reaction of the metal ions for a period of time. The liquid-phase reduction method enables production of metal particles that uniformly have a spherical or granular shape and are also fine particles. Examples of the water-soluble metal compound serving as the source of metal ions include, in the case of copper, copper(II) nitrate ($Cu(NO_3)_2$) and copper(II) sulfate pentahydrate ($CuSO_4.5H_2O$); in the case of silver, silver(I) nitrate ($AgNO_3$) and silver methanesulfonate ($CH_3SO_3Ag$); in the case of gold, tetrachloroauric(III) acid tetrahydrate ($HAuCl_4.4H_2O$); and, in the case of nickel, nickel(II) chloride hexahydrate ($NiCl_2.6H_2O$) and nickel(II) nitrate hexahydrate ($Ni(NO_3)_2.6H_2O$). Also for other metal particles, water-soluble compounds such as chlorides, nitrate compounds, and sulfate compounds can be used.

When the liquid-phase reduction method is employed to produce metal particles, various reducing agents are usable that can reduce and precipitate metal ions in a liquid-phase (aqueous solution) reaction systems. Examples of the reducing agents include sodium borohydride, sodium hypophosphite, hydrazine, transition metal ions such as trivalent titanium ions and divalent cobalt ions, ascorbic acid, reducing sugars such as glucose and fructose, and polyhydric alcohols such as ethylene glycol and glycerin. Of these, trivalent titanium ions are used to perform a titanium redox process: the redox action during oxidation into tetravalent ions is used to reduce metal ions to precipitate metal particles. The titanium redox process provides metal particles that uniformly have a small particle size. In addition, the titanium redox process can provide metal particles that have a spherical or granular shape. Thus, use of the titanium redox process enables filling with metal particles at higher density, to thereby form the first conductive layer 2 as a denser layer.

The particle size of metal particles can be controlled by adjusting the types and mixing proportions of the metal compound, dispersing agent, and reducing agent, and by adjusting, during the reduction reaction of the metal compound, the stirring rate, temperature, time, and pH, for example. For example, the pH of the reaction system is preferably adjusted to 7 or more and 13 or less in order to obtain metal particles having a very small particle size for this embodiment. At this time, a pH adjuster may be used to adjust the pH of the reaction system to be in such a range. This pH adjuster is a common acid or alkali such as hydrochloric acid, sulfuric acid, sodium hydroxide, or sodium carbonate. In particular, in order to prevent deterioration of surrounding members, preferred are nitric acid and ammonia that are free from impurity elements, for example, alkali metals, alkaline-earth metals, halogen elements such as chlorine, sulfur, phosphorus, and boron.

(Preparation of Conductive Ink)

Hereinafter, the method for preparing the conductive ink will be described. The dispersing agent contained in the conductive ink may be selected from various dispersing agents that have a molecular weight of 2,000 or more and 300,000 or less, and enable sufficient dispersion of metal particles precipitated in the dispersion medium. Use of such a dispersing agent having a molecular weight in the above-described range enables metal particles to be sufficiently dispersed in the dispersion medium, so that the resultant first conductive layer 2 has film properties of being dense and free from defects. When the dispersing agent has a molecular weight less than the lower limit, the effect of preventing aggregation of metal particles to maintain the dispersion may be insufficiently provided. As a result, the first conductive layer that is dense and has few defects may not be formed on the base film 1. On the other hand, when the dispersing agent has a molecular weight more than the upper limit, the dispersing agent may be excessively bulky, so that, in the heat treatment performed after application of the conductive ink, sintering between metal particles may be inhibited, which may result in generation of voids. In addition, when the dispersing agent is excessively bulky, the first conductive layer 2 may have a degraded film property of denseness, or the decomposition residue of the dispersing agent may cause a decrease in the conductivity.

The dispersing agent is preferably free from sulfur, phosphorus, boron, halogen, and alkali from the viewpoint of preventing deterioration of parts. Preferred examples of the dispersing agent include those having a molecular weight in the above-described range: amine-based polymeric dispersing agents such as polyethyleneimine and polyvinylpyrrolidone; hydrocarbon-based polymeric dispersing agents intramolecularly having carboxy groups such as polyacrylic acid and carboxymethylcellulose; and polymeric dispersing agents having polar groups such as poval (polyvinyl alcohol), styrene-maleic acid copolymers, olefin-maleic acid copolymers, and copolymers having a polyethyleneimine moiety and a polyethylene oxide moiety in a single molecule.

The dispersing agent may be dissolved in water or a water-soluble organic solvent, and the resultant solution may be added to the reaction system. The content of the dispersing agent is preferably 1 part by mass or more and 60 parts by mass or less relative to 100 parts by mass of the metal particles. The dispersing agent surrounds the metal particles to thereby prevent aggregation and sufficiently disperse the metal particles. However, when the content of the dispersing agent is less than the lower limit, this effect of preventing aggregation may be insufficiently provided. On the other hand, when the content of the dispersing agent is more than the upper limit, during heat treatment after application of the conductive ink, the dispersing agent in such an excessive amount may inhibit firing including sintering of the metal particles to cause generation of voids; or, the decomposition residue of the polymeric dispersing agent may remain as impurities in the first conductive layer to cause a decrease in the conductivity.

The content of water serving as a dispersion medium in the conductive ink is preferably 20 parts by mass or more and 1900 parts by mass or less relative to 100 parts by mass of the metal particles. Water serving as the dispersion medium causes the dispersing agent to be sufficiently swelled to thereby enable sufficient dispersion of the metal particles surrounded by the dispersing agent. However, when the water content is less than the lower limit, this effect of swelling the dispersing agent exerted by water may be insufficiently provided. On the other hand, when the water content is more than the upper limit, the conductive ink has a low content of the metal particles, which may hamper formation of a good first conductive layer having required thickness and density on the surfaces of the base film 1.

An organic solvent optionally added to the conductive ink may be selected from various water-soluble organic solvents. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of, for example, polyhydric alcohols such as ethylene glycol and glycerin; and glycol ethers such as ethylene glycol monoethyl ether and diethylene glycol monobutyl ether.

The content of the water-soluble organic solvent is preferably 30 parts by mass or more and 900 parts by mass or less relative to 100 parts by mass of the metal particles. When the content of the water-soluble organic solvent is less than the lower limit, the effect of adjusting the viscosity of the dispersion liquid and adjusting the vapor pressure, the effect being exerted by the organic solvent, may be insufficiently provided. On the other hand, when the content of the water-soluble organic solvent is more than the upper limit, the effect of swelling the dispersing agent exerted by water may be insufficiently provided, which may result in occurrence of aggregation of the metal particles in the conductive ink.

Incidentally, when the liquid-phase reduction method is employed to produce the metal particles, metal particles precipitated in a liquid-phase (aqueous solution) reaction system are subjected to steps such as filtering off, washing, drying, and pulverization, and the resultant powder is used for preparation of the conductive ink. In this case, the metal particles in powder form, water serving as the dispersion medium, a dispersing agent, and optionally a water-soluble organic solvent may be mixed with predetermined proportions to thereby prepare a conductive ink containing the metal particles. In this case, the liquid phase (aqueous solution) in which the metal particles are precipitated is preferably used as the starting material to prepare the conductive ink. Specifically, the liquid phase (aqueous solution) containing precipitated metal particles is subjected to processes such as ultrafiltration, centrifugation, washing with water, and electrodialysis to remove impurities, and optionally concentrated to remove water. Alternatively, water is conversely added to adjust the concentration of the metal particles, and optionally a water-soluble organic solvent is then added with a predetermined proportion to prepare a conductive ink containing the metal particles. This method prevents generation of coarse and nonuniform particles due to aggregation of the metal particles during drying, which facilitates formation of a dense and uniform first conductive layer 2.

(Application of Conductive Ink)

The method of applying the conductive ink containing dispersed metal particles to both surfaces of the base film 1 can be selected from conventional and known coating methods such as bar coating, spray coating, and dip coating. Of these, bar coating is preferred because it enables uniform application of the conductive ink to both surfaces of the base film 1, and also filling of the openings 4 with the conductive ink with certainty.

(Heat Treatment)

The conductive ink is applied to both surfaces of the base film 1, dried, and subsequently heat-treated. The conductive ink is applied to both surfaces of the base film 1 and then heat-treated, to thereby provide the first conductive layer 2 as a fired coating layer fixed to both surfaces of the base film 1 and the inner walls of the openings 4. The heat treatment causes the dispersing agent and other organic matter contained in the applied conductive ink to be removed from the coating layer through evaporation and decomposition. As a result, the metal particles are left in a sintered state or at a pre-sintered stage in which metal particles are closely in contact with each other to achieve bonding between the solids.

In regions of the first conductive layer 2, the regions being near the interfaces between the first conductive layer 2 and the base film 1, the heat treatment causes oxidation of the metal particles, to thereby suppress generation of a metal hydroxide species based on the metal of the metal particles, and to generate a metal oxide species based on the metal. Specifically, for example, when copper is used for the metal particles, copper oxide and copper hydroxide are generated in regions of the first conductive layer 2, the regions being near the interfaces between the first conductive layer 2 and the base film 1, and the amount of generation is larger for the copper oxide. The copper oxide generated in the near-interface regions of the first conductive layer 2 strongly bonds to the polyimide forming the base film 1, which increases the adhesion strength between the first conductive layer 2 and the base film 1.

The heat treatment is performed in an atmosphere having a certain oxygen content. Regarding the atmosphere in the heat treatment, the lower limit of the oxygen concentration is 1 ppm, more preferably 10 ppm. The upper limit of the oxygen concentration is 10,000 ppm, more preferably 1,000 ppm. When the oxygen concentration is less than the lower limit, the amount of copper oxide generated decreases in the near-interface regions of the first conductive layer 2, so that an insufficient adhesion strength may be provided between the first conductive layer 2 and the base film 1. On the other hand, when the oxygen concentration is more than the upper limit, the metal particles are excessively oxidized, which may result in a decrease in the conductivity of the first conductive layer 2.

The lower limit of the temperature of the heat treatment is 150° C., more preferably 200° C. The upper limit of the temperature of the heat treatment is 500° C., more preferably 400° C. When the temperature of the heat treatment is less than the lower limit, the amount of copper oxide generated decreases in the near-interface regions of the first conductive layer 2, so that an insufficient adhesion strength may be provided between the first conductive layer 2 and the base film 1. On the other hand, when the temperature of the heat treatment is more than the upper limit and the base film 1 is formed of an organic resin such as polyimide, the base film 1 may be deformed.

In summary, adjustments of the oxygen concentration of the atmosphere and the heating temperature during the heat treatment enable control of the amount of the metal oxide species generated in the regions near the interfaces between the base film 1 and the first conductive layer 2. As a result, the adhesion strength between the first conductive layer 2 and the base film 1 can be controlled.

<Second-Conductive-Layer Formation Step>

Figure 2D:
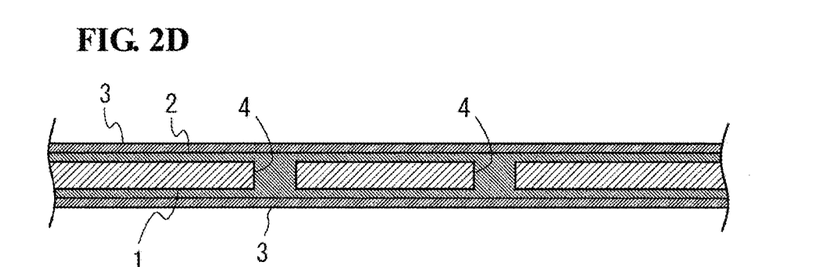
FIG. 2D is a schematic partial sectional view illustrating a step subsequent to that of FIG. 2C in the method for producing the substrate for a printed circuit board in FIG. 1.

In the second-conductive-layer formation step, as illustrated in FIG. 2D, second conductive layers 3 are formed by electroless plating on the externally exposed surfaces of the first conductive layer 2, which is formed on the base film 1 in the first-conductive-layer formation step.

Incidentally, the electroless plating is performed together with processes such as a cleaner step, a water-washing step, an acid treatment step, a water-washing step, a pre-dip step, an activator step, a water-washing step, a reduction step, and a water-washing step.

When the conductive layer is required to have an average thickness of, for example, 1 μm or more, electroless plating is performed and then electroplating is further performed until the required thickness of the conductive layer is achieved. This electroplating can be performed with a conventional and known electroplating bath corresponding to the plating metal such as copper, nickel, or silver and under conditions appropriately selected, such that a conductive layer having a predetermined thickness without defects can be quickly formed.

After the second-conductive-layer formation step is performed to form the second conductive layers 3, additional heat treatment is preferably performed. Such a heat treatment performed after formation of the second conductive layers 3 causes a further increase in the amount of the metal oxide species in regions of the first conductive layer 2, the regions being near the interfaces between the first conductive layer 2 and the base film 1, resulting in a further increase in the adhesion strength between the base film 1 and the first conductive layer 2.

[Printed Circuit Board]

The printed circuit board is produced by forming conductive patterns in the substrate for a printed circuit board in FIG. 1. The conductive patterns are formed in the first conductive layer 2 and the second conductive layers 3 of the substrate for a printed circuit board by a subtractive method or a semi-additive method.

[Method for Producing Printed Circuit Board]

Hereinafter, description will be made regarding an embodiment of the method for producing the printed circuit board employing the above-described substrate for a printed circuit board. Here, the case of forming the conductive patterns by a subtractive method will be described.

Figure 3A:
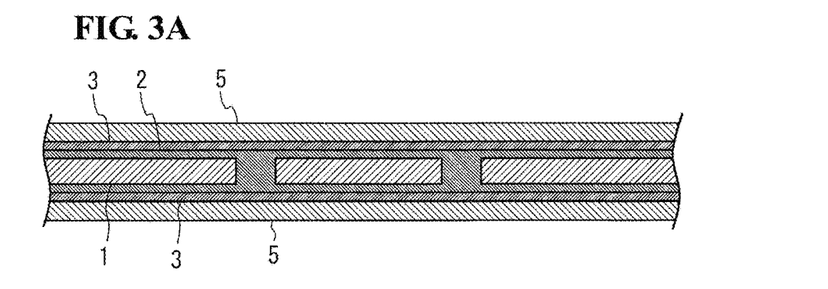
FIG. 3A is a schematic partial sectional view illustrating a method for producing a printed circuit board using the substrate for a printed circuit board in FIG. 1.
Figure 3B:
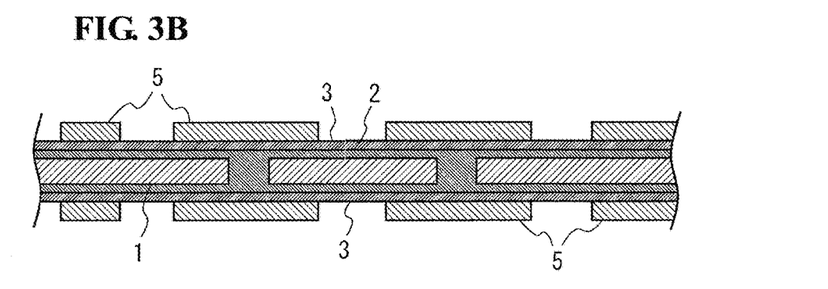
FIG. 3B is a schematic partial sectional view illustrating a step subsequent to that of FIG. 3A in the method for producing a printed circuit board using the substrate for a printed circuit board in FIG. 1.
Figure 3C:
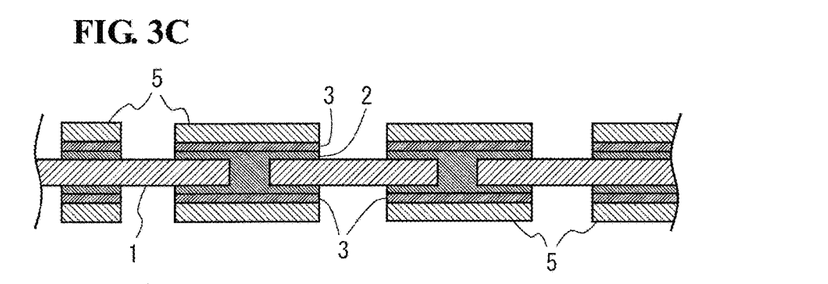
FIG. 3C is a schematic partial sectional view illustrating a step subsequent to that of FIG. 3B in the method for producing a printed circuit board using the substrate for a printed circuit board in FIG. 1.
Figure 3D:
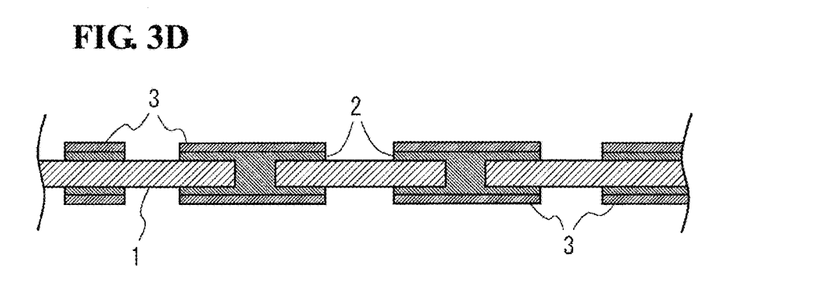
FIG. 3D is a schematic partial sectional view illustrating a step subsequent to that of FIG. 3C in the method for producing a printed circuit board using the substrate for a printed circuit board in FIG. 1.

As illustrated in FIG. 3A, a photosensitive resist 5 is first formed so as to cover both surfaces of the substrate for a printed circuit board, the substrate having been adjusted to a predetermined size. Subsequently, as illustrated in FIG. 3B, the resist 5 is patterned so as to correspond to the conductive patterns by exposure and development, for example. Subsequently, as illustrated in FIG. 3C, portions of the second conductive layers 3 and the first conductive layer 2 other than the conductive patterns are etched off through the resist 5 serving as a mask. Finally, as illustrated in FIG. 3D, the remaining resist 5 is removed, to thereby provide a printed circuit board having the conductive patterns formed on the base film 1.

Here, the description has been made regarding the method for producing a printed circuit board in which circuitry is formed by the subtractive method. Alternatively, the printed circuit board can also be produced by forming circuitry by another known production method such as a semi-additive method. Since the printed circuit board is produced with the above-described substrate for a printed circuit board, it has high conductivity, and also has high adhesion strength between the base film 1 and the first conductive layer 2, so that the conductive layer is less likely to separate from the base film 1.

Advantages

In the substrate for a printed circuit board, the conductive ink containing metal particles is applied and heat-treated so that the first conductive layer densely fills the opening of the base film. As a result, the substrate has high conductivity.

In addition, in the substrate for a printed circuit board, the opening of the base film is filled with the first conductive layer, so that a land for mounting an electronic component can be provided also above the opening filled with the first conductive layer. This can provide a printed circuit board having a large area for mounting components. In addition, since the opening of the base film is filled with the first conductive layer, use of this substrate for a printed circuit board facilitates formation of a multilayer substrate having interstitial via holes.

Other Embodiments

The embodiments disclosed herein are mere examples in all respects and should be understood as being non-limitative. The scope of the present invention is not limited to the above-described configurations of the embodiments and is indicated by Claims. The scope of the present invention is intended to embrace all the modifications within the meaning and range of equivalency of the Claims.

In the above-described embodiment, as illustrated in FIG. 2C, the conductive ink containing metal particles is applied to both surfaces of the base film 1. However, prior to the application of the conductive ink, both surfaces of the base film 1 may be subjected to a hydrophilic treatment. By subjecting the base film 1 to such a hydrophilic treatment, the conductive ink exhibits a decreased surface tension to the base film 1. This facilitates uniform application of the conductive ink to the base film 1.

In the above-described embodiment, for the purpose of enhancing the adhesion strength between the first conductive layer and the base film, the method of controlling the amount of metal oxide species in the regions near the interfaces between the base film and the first conductive layer is described. For this purpose of enhancing the adhesion strength between the first conductive layer and the base film, instead of controlling the amount of the metal oxide species, an interposed layer for enhancing the adhesion strength may be disposed between the base film and the first conductive layer. For example, interposed layers composed of at least one element selected from nickel (Ni), chromium (Cr), titanium (Ti), and silicon (Si) may be disposed between the base film and the first conductive layer, to thereby enhance the adhesion strength between the base film and the first conductive layer. Such interposed layers can be obtained in the following manner: for example, a base film formed of a resin such as polyimide is subjected to an alkali treatment to expose functional groups on the surfaces of the base film, and the functional groups are subjected to metal acid. Regarding the silicon, the layers can be obtained by subjecting an insulating resin base film to a silane coupling treatment.

Examples

Hereinafter, the present invention will be described further in detail with reference to Examples; however, the present invention is not limited to these Examples.

[Reflow-Resistance Evaluation]

Substrates for printed circuit boards of four Examples were produced with base films differing in the diameters of openings and were subjected to reflow-resistance evaluation.

As the base films having an insulating property, polyimide films having an average thickness of 25 µm (Kapton "EN-S" from DU PONT-TORAY CO., LTD.) were used and openings were formed with a laser. In such four polyimide films, openings having diameters of 20 µm, 30 µm, 40 µm, and 50 µm were formed. Subsequently, the base films having the openings were subjected to plasma treatment to perform hydrophilic treatment for the surfaces of the base films and the inner walls of the openings. On the other hand, water was used as a medium, and copper particles having a mean particle size of 60 nm were dispersed in the medium that was water, to prepare a conductive ink having a copper concentration of 26 mass %. This conductive ink was applied to both surfaces of the base films to fill the openings. At this time, the conductive ink was found to exhibit a surface tension of 62 mN/m. After that, a heat treatment was further performed at 350° C. for 30 minutes in a nitrogen atmosphere having an oxygen concentration of 100 ppm.

Each of these substrates for printed circuit boards of four Examples differing in the diameters of openings was measured for the initial via resistance (a resistance between both ends of an opening filled with the conductive ink) and for a via resistance after reflowing was performed twice. As a result, in each substrate for a printed circuit board, no change was observed between the via resistances. This has demonstrated that the openings filled with the conductive ink have high reflow resistance.

[Evaluations for Land-Part Formability and Land-Part Retention]

For the sake of reference, evaluations were performed in terms of relationship between land-part formability above an opening and land-part retention and, for example, the diameter of the opening and the surface tension of the conductive ink.

As Reference Examples, 13 types of substrates for printed circuit boards were produced as Evaluation No. 1 to No. 13 described in Table 1.

An Evaluation No. 1 substrate for a printed circuit board was produced in the following manner. As a base film having an insulating property, a polyimide film having an average thickness of 25 µm (Kapton "EN-S" from DU PONT-TORAY CO., LTD.) was used. In this base film, an opening was first formed with a laser so as to have a laser-irradiation-side diameter of 80 µm. Subsequently, the base film having the opening was subjected to plasma treatment to perform hydrophilic treatment for the surfaces of the base film and the inner wall of the opening. On the other hand, water was used as a medium, and copper particles having a mean particle size of 60 nm were dispersed in the medium that was water, to prepare a conductive ink having a copper concentration of 26 mass %. Subsequently, this conductive ink was applied to both surfaces of the base film to fill the opening. At this time, the conductive ink was found to exhibit a surface tension of 62 mN/m. After that, a heat treatment was further performed at 350° C. for 30 minutes in a nitrogen atmosphere having an oxygen concentration of 100 ppm. Incidentally, at the time of formation of the opening with a laser, a diameter of the opening at a surface of the base film, the surface being on a side opposite to the laser irradiation side, was found to be 76 μm. Hereafter, a diameter of an opening at the laser-irradiation-side surface of a base film will be referred to as "upper diameter", while a diameter of the opening at a surface on a side opposite to the laser irradiation side will be referred to as "lower diameter".

An Evaluation No. 2 substrate for a printed circuit board was produced as in Evaluation No. 1 except that the base film used had an opening having an upper diameter of 80 μm and a lower diameter of 70 μm; and the conductive ink used contained copper particles having a mean particle size of 52 nm and being dispersed in a mixed medium of water and ethanol, and exhibited a surface tension of 25 mN/m.

An Evaluation No. 3 substrate for a printed circuit board was produced as in Evaluation No. 1 except that the base film used had an opening having an upper diameter of 40 μm and a lower diameter of 32 μm; and the conductive ink used contained copper particles having a mean particle size of 68 nm and being dispersed in water as the medium, and exhibited a surface tension of 55 mN/m.

An Evaluation No. 4 substrate for a printed circuit board was produced as in Evaluation No. 1 except that the base film used had an opening having an upper diameter of 120 μm and a lower diameter of 109 μm.

An Evaluation No. 5 substrate for a printed circuit board was produced as in Evaluation No. 1 except that the base film used had an opening having an upper diameter of 80 μm and a lower diameter of 68 μm; and the conductive ink used contained copper particles having a mean particle size of 63 nm and being dispersed in ethanol as the medium, and exhibited a surface tension of 15 mN/m.

An Evaluation No. 6 substrate for a printed circuit board was produced as in Evaluation No. 1 except that the base film used had an opening having an upper diameter of 100 μm and a lower diameter of 89 μm; and the conductive ink used contained copper particles having a mean particle size of 75 nm and being dispersed in water as the medium, and exhibited a surface tension of 68 mN/m.

An Evaluation No. 7 substrate for a printed circuit board was produced as in Evaluation No. 1 except that the base film used was a polyimide film having an average thickness of 50 μm (Kapton "EN-S" from DU PONT-TORAY CO., LTD.) and having an opening having an upper diameter of 100 μm and a lower diameter of 95 μm; and the conductive ink used contained copper particles having a mean particle size of 82 nm and being dispersed in water as the medium, and exhibited a surface tension of 88 mN/m.

An Evaluation No. 8 substrate for a printed circuit board was produced as in Evaluation No. 1 except that the base film used was a polyimide film having an average thickness of 12 μm (Kapton "EN-S" from DU PONT-TORAY CO., LTD.) and having an opening having an upper diameter of 60 μm and a lower diameter of 51.6 μm; and the conductive ink used contained copper particles having a mean particle size of 82 nm and being dispersed in water as the medium, and exhibited a surface tension of 65 mN/m.

An Evaluation No. 9 substrate for a printed circuit board was produced as in Evaluation No. 1 except that the base film used had an opening having an upper diameter of 150 μm and a lower diameter of 132 μm; and the conductive ink used contained copper particles having a mean particle size of 75 nm and being dispersed in water as the medium, and exhibited a surface tension of 68 mN/m.

An Evaluation No. 10 substrate for a printed circuit board was produced as in Evaluation No. 1 except that the base film used was a polyimide film having an average thickness of 50 μm and having an opening having an upper diameter of 30 μm and a lower diameter of 28.8 μm; and the conductive ink used contained copper particles having a mean particle size of 55 nm and being dispersed in a mixed medium of water and ethanol, and exhibited a surface tension of 22 mN/m.

An Evaluation No. 11 substrate for a printed circuit board was produced as in Evaluation No. 1 except that the base film used had an opening having an upper diameter of 100 μm and a lower diameter of 15 μm; and the conductive ink used contained copper particles having a mean particle size of 68 nm and being dispersed in water as the medium, and exhibited a surface tension of 55 mN/m.

An Evaluation No. 12 substrate for a printed circuit board was produced as in Evaluation No. 1 except that the base film used had an opening having an upper diameter of 100 μm and a lower diameter of 94 μm; and the conductive ink used contained copper particles having a mean particle size of 541 nm and being dispersed in water as the medium, and exhibited a surface tension of 54 mN/m.

An Evaluation No. 13 substrate for a printed circuit board was produced as in Evaluation No. 1 except that the base film used had an opening having an upper diameter of 100 μm and a lower diameter of 89 μm; the conductive ink used contained copper particles having a mean particle size of 75 nm and being dispersed in water as the medium, and exhibited a surface tension of 68 mN/m; and a heat treatment was performed at 500° C. for 8 hours in a nitrogen atmosphere having an oxygen concentration of 100 ppm.

(Evaluation for Land-Part Formability)

Sections of the heat-treated substrates for printed circuit boards in Evaluation No. 1 to No. 13 were observed with, for example, an optical microscope (polarizing microscope "OPTIPHOT-2" from NIKON CORPORATION) and an electron microscope (analytical scanning electron microscope "JSM-6390A" from JEOL Ltd.) and examined as to whether the openings were filled with the conductive inks or not. The substrates whose openings were filled with conductive inks were regarded as having a high capability of formation of land parts above the openings and, as a result, evaluated as "A". On the other hand, the substrates whose openings were not filled with conductive inks were regarded as having a low capability of formation of land parts above the openings and, as a result, evaluated as "B". Such evaluation results are described in Table 1.

(Evaluation for Land-Part Retention)

Circuits were formed in the heat-treated substrates for printed circuit boards in Evaluation No. 1 to No. 13 to produce printed circuit boards. Specifically, in the substrates for printed circuit boards in Evaluation No. 1 to No. 13, second conductive layers were formed by electroless plating and conductive patterns were formed by a subtractive method. During a series of such circuit formation steps, printed circuit boards in which the conductive layers formed from the conductive inks within the openings did not fall off were regarded as having high land-part retention and, as a result, evaluated as "A". On the other hand, during a series of such circuit formation steps, printed circuit boards in which the conductive layers formed within the openings fell off were regarded as having low land-part retention and, as a result, evaluated as "B". Such evaluation results are described in Table 1.

Incidentally, in Table 1, "opening diameter ratio" denotes the ratio of the lower diameter to the upper diameter; "recess ratio" denotes a ratio [%] of the maximum depth, with respect to the surface with the upper diameter of the base film, of the recess in the conductive layer formed within the opening and formed by application of the conductive ink, to the average thickness of the base film; and "aspect ratio" denotes a ratio of the average thickness of the base film to the upper diameter of the opening.

a low porosity, a porosity of less than 1% results in insufficient land-part retention. This is probably because the heat treatment at high temperature for a long time was performed to decrease the porosity, so that the base film was degraded, which resulted in a decrease in the separation strength between the base film and the conductive layer formed from the conductive ink.

TABLE 1

| Evaluation No. | Medium | Film thickness (mm) | Particle size (nm) | Upper diameter (mm) | Surface tension (mN/m) | Porosity (%) | Recess ratio (maximum recess depth/film thickness) (%) | Opening diameter ratio (lower diameter/ upper diameter) | Aspect ratio (film thickness/ upper diameter) | Land-part formability | Land-part retention |
|---|---|---|---|---|---|---|---|---|---|---|---|
| 1 | Water | 25 | 60 | 80 | 62 | 6 | 8 | 0.95 | 0.31 | A | A |
| 2 | Water + Ethanol | 25 | 52 | 80 | 25 | 12 | 22 | 0.88 | 0.31 | A | A |
| 3 | Water | 25 | 68 | 40 | 55 | 10 | 13 | 0.80 | 0.63 | A | A |
| 4 | Water | 25 | 60 | 120 | 62 | 15 | 75 | 0.91 | 0.21 | B | A |
| 5 | Ethanol | 25 | 63 | 80 | 15 | 7 | 82 | 0.85 | 0.31 | B | A |
| 6 | Water | 25 | 75 | 100 | 68 | 15 | 8 | 0.89 | 0.25 | A | A |
| 7 | Water | 50 | 82 | 100 | 88 | 18 | 13 | 0.95 | 0.20 | A | A |
| 8 | Water | 12 | 82 | 60 | 65 | 15 | 10 | 0.86 | 0.20 | A | A |
| 9 | Water | 25 | 75 | 150 | 68 | 17 | 55 | 0.88 | 0.17 | B | A |
| 10 | Water + Ethanol | 50 | 55 | 30 | 22 | 14 | 68 | 0.96 | 1.7 | B | A |
| 11 | Water | 25 | 68 | 100 | 55 | 10 | 65 | 0.13 | 0.25 | B | A |
| 12 | Water | 25 | 541 | 100 | 54 | 65 | 15 | 0.94 | 0.25 | A | B |
| 13 | Water | 25 | 75 | 100 | 68 | 0.5 | 10 | 0.89 | 0.25 | A | B |

The results of Reference Examples in Table 1 indicate that, by setting the upper diameter, the surface tension, the opening diameter ratio, and the aspect ratio to be in appropriate ranges, filling of the opening with a conductive ink can be achieved, which enhances the land-part formability above the opening.

Specifically, the results of the Evaluation No. 4 and No. 9 substrates for printed circuit boards indicate that an excessively large diameter of an opening inhibits filling of the opening with a conductive ink even though the conductive ink exhibits high surface tension.

Comparison between the results of the Evaluation No. 1, No. 2, and No. 5 substrates for printed circuit boards indicates that, in spite of openings having the same upper diameter, use of a conductive ink exhibiting low surface tension inhibits filling of such an opening with the conductive ink.

In the Evaluation No. 10 substrate for a printed circuit board, the aspect ratio is relatively high and the surface tension is relatively low, which probably makes it difficult to achieve filling of the central portion of the opening with the conductive ink. This results in a high recess ratio and low land-part formability.

The results of the Evaluation No. 11 substrate for a printed circuit board indicate that an excessively small opening diameter ratio probably makes it difficult to achieve filling of the central portion of the opening with the conductive ink. This results in a high recess ratio and low land-part formability.

The results of the Evaluation No. 12 substrate for a printed circuit board indicate that a porosity of higher than 50% results in insufficient separation strength between the base film and the land part, so that the land part is less likely to be retained. The results of the Evaluation No. 13 substrate for a printed circuit board indicate that, even in the case of

INDUSTRIAL APPLICABILITY

As described above, since the openings of base films are densely filled with conductors to provide high conductivity, a substrate for a printed circuit board, a printed circuit board, and a method for producing a substrate for a printed circuit board according to the present invention are suitably used for printed circuit boards required to have high-density printed circuits.

REFERENCE SIGNS LIST 1 base film
2 first conductive layer
3 second conductive layer
4 opening
5 resist

The invention claimed is:
1. A substrate for a printed circuit board, comprising:
a base film having an insulating property and including at least one opening;
a first conductive layer that is formed on both surfaces of the base film by applying and heat-treating a conductive ink containing metal particles, and that fills the at least one opening; and
a second conductive layer formed, by plating, on at least one of surfaces of the first conductive layer,
wherein out of diameters of the at least one opening that are positioned at the both surfaces of the base film, the diameter at one surface of the base film is larger than the diameter at the other surface of the base film, and
wherein a ratio of an average thickness of the base film to a larger diameter out of the diameters of the at least one opening that are positioned at both of the surfaces of the base film is 0.2 or more and 2.0 or less.
2. The substrate for a printed circuit board according to claim 1, wherein the metal particles have a mean particle size of 1 nm or more and 500 nm or less.

3. The substrate for a printed circuit board according to claim 1, wherein both of the surfaces of the base film are subjected to a hydrophilic treatment.

4. The substrate for a printed circuit board according to claim 1, wherein the metal is copper.

5. The substrate for a printed circuit board according to claim 1, wherein regions of the first conductive layer, the regions each being within 500 nm from an interface between the first conductive layer and one or another of the surfaces of the base film, and a region within the at least one opening have a porosity of 1% or more and 50% or less.

6. The substrate for a printed circuit board according to claim 1, wherein a ratio of a maximum depth, with respect to one of the surfaces of the base film, of a recess of the first conductive layer formed within the at least one opening, to an average thickness of the base film is 50% or less.

7. The substrate for a printed circuit board according to claim 1, wherein a ratio of one diameter to another diameter out of diameters of the at least one opening that are positioned at both of the surfaces of the base film is 0.2 or more and less than 1.0.

8. The substrate for a printed circuit board according to claim 1, wherein regions near interfaces between the base film and the first conductive layer contain a metal oxide species based on the metal of the metal particles.

9. The substrate for a printed circuit board according to claim 8, wherein the metal oxide species has a mass per unit area of 0.1 $\mu g/cm^2$ or more and 10 $\mu g/cm^2$ or less, and a mass ratio of the metal oxide species to the metal hydroxide species is 0.1 or more.

10. A printed circuit board comprising a conductive pattern,
wherein the conductive pattern is formed by performing a subtractive method or a semi-additive method on the first conductive layer and the second conductive layer of the substrate for a printed circuit board according to claim 1.

11. The substrate for a printed circuit board according to claim 1, wherein the both surfaces of the base film are uniformly covered by the first conductive layer.

* * * * *